United States Patent
Masuda et al.

(10) Patent No.: US 9,780,116 B2
(45) Date of Patent: Oct. 3, 2017

(54) SEMICONDUCTOR DEVICE AND METHOD FOR MANUFACTURING THE SAME

(71) Applicant: TOSHIBA MEMORY CORPORATION, Minato-ku (JP)

(72) Inventors: Hideaki Masuda, Nagoya (JP); Katsuyasu Shiba, Yokkaichi (JP); Nobuhide Yamada, Nagoya (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/530,150

(22) Filed: Dec. 8, 2016

(65) Prior Publication Data

US 2017/0104003 A1    Apr. 13, 2017

Related U.S. Application Data

(62) Division of application No. 14/850,365, filed on Sep. 10, 2015, now abandoned.

(60) Provisional application No. 62/132,916, filed on Mar. 13, 2015.

(51) Int. Cl.
| | |
|---|---|
| H01L 27/115 | (2017.01) |
| H01L 27/11582 | (2017.01) |
| H01L 21/02 | (2006.01) |
| H01L 21/28 | (2006.01) |
| H01L 21/311 | (2006.01) |

(52) U.S. Cl.
CPC .... H01L 27/11582 (2013.01); H01L 21/0217 (2013.01); H01L 21/02164 (2013.01); H01L 21/02274 (2013.01); H01L 21/28282 (2013.01); H01L 21/31111 (2013.01)

(58) Field of Classification Search
None
See application file for complete search history.

(56) References Cited

U.S. PATENT DOCUMENTS

| | | | |
|---|---|---|---|
| 6,268,299 B1 | 7/2001 | Jammy | |
| 2010/0059811 A1 | 3/2010 | Sekine | |
| 2010/0163968 A1 | 7/2010 | Kim | |
| 2011/0115014 A1 | 5/2011 | Ichinose | |
| 2012/0098051 A1 | 4/2012 | Son | |
| 2013/0049095 A1* | 2/2013 | Whang | H01L 27/11556 257/321 |
| 2013/0072027 A1 | 3/2013 | Ota et al. | |

(Continued)

FOREIGN PATENT DOCUMENTS

| | | |
|---|---|---|
| JP | 2007-073811 | 3/2007 |
| JP | 2012-151278 | 8/2012 |

*Primary Examiner* — Benjamin Sandvik
(74) *Attorney, Agent, or Firm* — Oblon, McClelland, Maier & Neustadt, L.L.P.

(57) ABSTRACT

According to one embodiment, a semiconductor device includes a stacked body and a pillar. The stacked body includes insulating films, electrode films, and silicon containing films. Each of the insulating films and each of the electrode films are stacked alternately. One of the silicon containing films is provided between one of the insulating films and one of the electrode films. The pillar extends in the stacked body in a stacking direction of the insulating films and the electrode films. The pillar includes a silicon pillar and a memory film. The silicon pillar extends in the stacking direction. The memory film is provided between the silicon pillar and one of the electrode films.

9 Claims, 22 Drawing Sheets

(56) References Cited

U.S. PATENT DOCUMENTS

2013/0084712 A1    4/2013  Yuasa et al.
2013/0119531 A1*  5/2013  Tanaka .............. H01L 21/28273
                                                                              257/734
2013/0161725 A1    6/2013  Park
2013/0234233 A1    9/2013  Fujiwara

* cited by examiner

SEMICONDUCTOR DEVICE AND METHOD FOR MANUFACTURING THE SAME

CROSS-REFERENCE TO RELATED APPLICATIONS

This application is a divisional of U.S. application Ser. No. 14/850,365, filed Sep. 10, 2015, and is based upon and claims the benefit of priority from U.S provisional patent application 62/132,916, filed on Mar. 13, 2015; the entire contents of each of which are incorporated herein by reference.

FIELD

Embodiments relate to a semiconductor device and a method for manufacturing the same.

BACKGROUND

High integration in semiconductor devices has been pursued, and a stacked type semiconductor device having insulating films and word lines stacked alternately has been proposed. To achieve stable characteristics, it is favorable to suppress a variation in the thicknesses of the word lines in the stacked type semiconductor device.

DETAILED DESCRIPTION

According to one embodiment, a semiconductor device includes a stacked body and a pillar. The stacked body including a plurality of insulating films, a plurality of electrode films alternately stacked with the insulating layers in a stacked direction, and a plurality silicon containing films, one of the silicon containing films being provided between one of the insulating films and one of the electrode films. The pillar extends in the stacked body in the stacking direction. The pillar includes a silicon pillar extending in the stacking direction; and a memory film provided between the silicon pillar and one of the electrode films.

According to one embodiment, a method of manufacturing a semiconductor device includes forming a stacked body. The stacked body includes a first insulating film, a first silicon containing film provided on the first insulating film, a filing film provided on the first silicon containing film, and a second silicon containing film provided on the filing film. The first silicon containing film contains silicon and nitride. The filing film contains silicon and nitride. A silicon concentration in the filing film is lower than a silicon concentration in the first silicon containing film. The second silicon containing film contains silicon and nitride. A silicon concentration in the second silicon containing film is higher than the silicon concentration of the filing film. The method further includes forming a memory hole penetrating the stacked body in a stacking direction of the first insulating film, the first silicon containing film, the filing film, and the second silicon containing film. The method further includes forming a charge storage film on a surface of the memory hole; forming a second insulating film on a surface of the charge storage film; forming a semiconductor pillar on a surface of the second insulating film. The method further includes forming a slit in the stacked body. The slit extends along a plane including the stacking direction. The method further includes removing the filing film through the slit. The method further includes forming a third insulating film on the first insulating film, the first silicon containing film, the second silicon containing film and the charge storage film through the slit. The method further includes depositing a conductive material on the third insulating film and in a space through the slit to form an electrode film, the space being formed after the filing film being removed. The method further includes removing a portion of the electrode film adjacent to the slit to divide the electrode film along the stacking direction.

Various embodiments will be described hereinafter with reference to the accompanying drawings.
(Embodiments)

A semiconductor device according to the embodiment is a stacked non-volatile semiconductor memory device.

Figure 1:
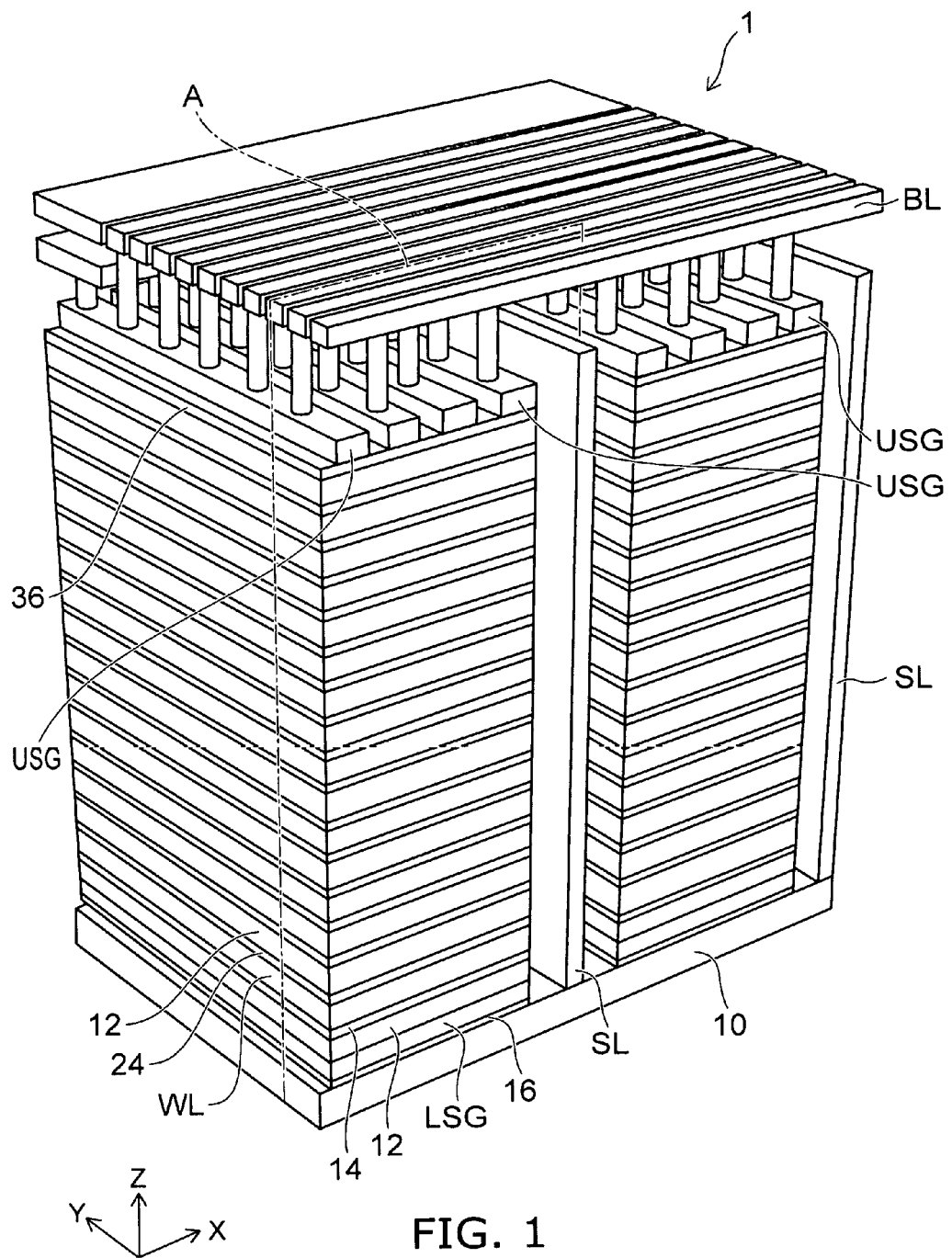
FIG. 1 is a perspective view illustrating a semiconductor device according to an embodiment.

FIG. 1 is a perspective view illustrating a semiconductor device according to the embodiment.

Figure 2:
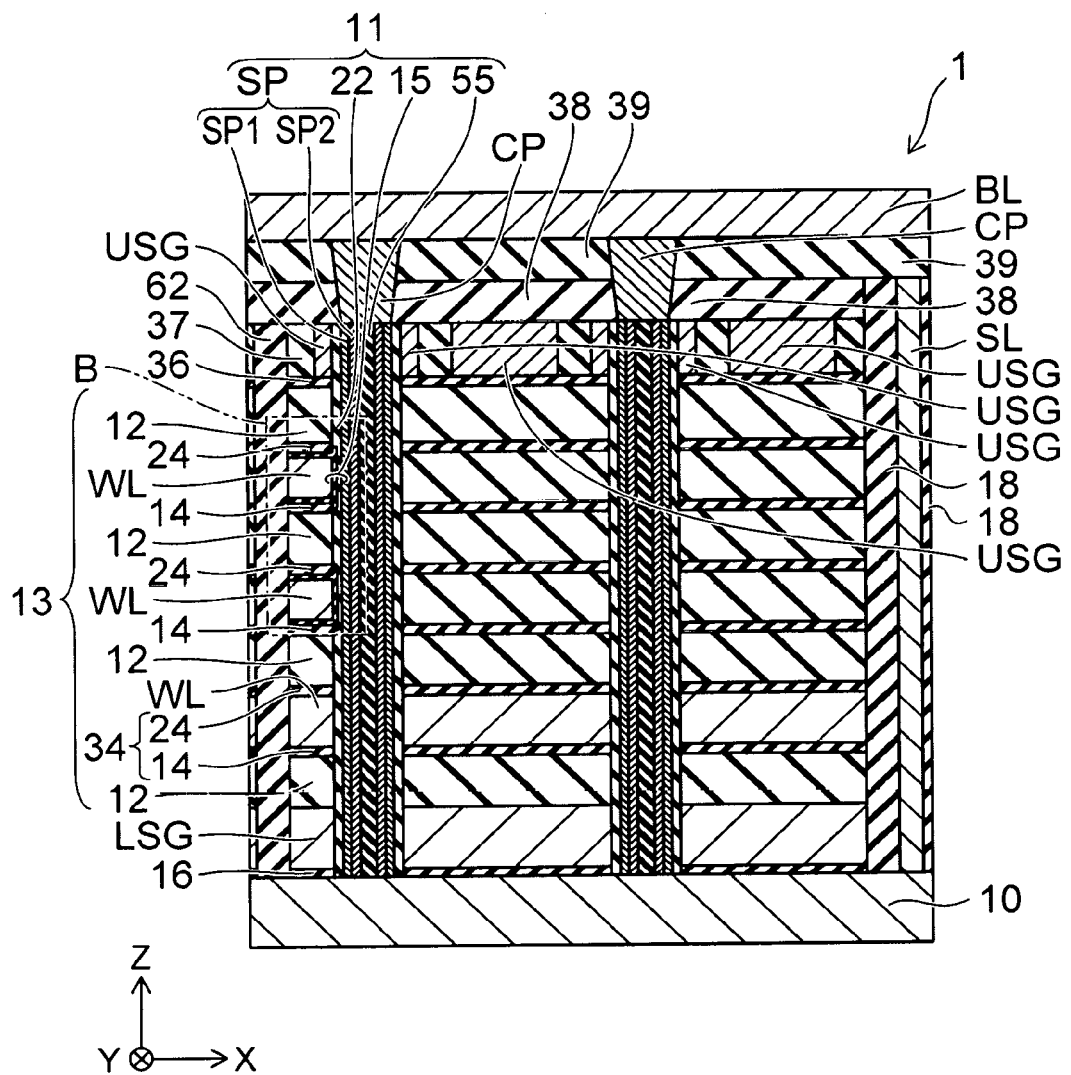
FIG. 2 is a cross-sectional view illustrating a portion A illustrated in FIG. 1.

FIG. 2 is a cross-sectional view illustrating a portion A illustrated in FIG. 1. The number of insulating films 12 is four in the cross-sectional view.

As illustrated in FIGS. 1 and 2, a semiconductor device 1 according to the embodiment is provided with a substrate 10 on which an insulating film 16 is provided. Hereinafter, an XYZ orthogonal coordinate system is used for convenience of explanation. That is, two directions that are parallel to the contact surface between the substrate 10 and the insulating film 16 and are orthogonal to each other are referred to as "a X-direction" and "a Y-direction." An upward direction that is perpendicular to the contact surface between the substrate 10 and the insulating film 16 is referred to as "a Z-direction."

A lower selection gate electrode LSG is provided on the insulating film 16. A stacked body 13 and an insulating film 36 are provided on the lower selection gate electrode LSG along the Z-direction from the bottom. An insulating film 37 and upper selection gate electrodes USG are provided on the insulating film 36. An insulating film 38, an insulating film 39, and bit lines BL are provided on the insulating film 37 and the upper selection gate electrodes USG along the Z-direction from the bottom.

The stacked body 13 has the insulating films 12 and word lines WL stacked alternately. A first silicon containing film 14 or a second silicon containing film 24 is provided between the insulating film 12 and the word line WL. The first silicon containing film 14 corresponds to a first silicon-rich film. The second silicon containing film 24 corresponds to a second silicon-rich film. The first silicon containing film 14 and the second silicon containing film 24 are also generically referred to as silicon containing film 34. The silicon containing film 34 corresponds to a silicon-rich film.

The upper selection gate electrodes USG are isolated from one another in the X-direction, and extend in the Y-direction. A space between the upper selection gate electrodes USG is filled with the insulating film 37. Pillars 11 are provided on the substrate 10, penetrating in the Z-direction from the upper selection gate electrode USG to the insulating film 16.

Figure 3:
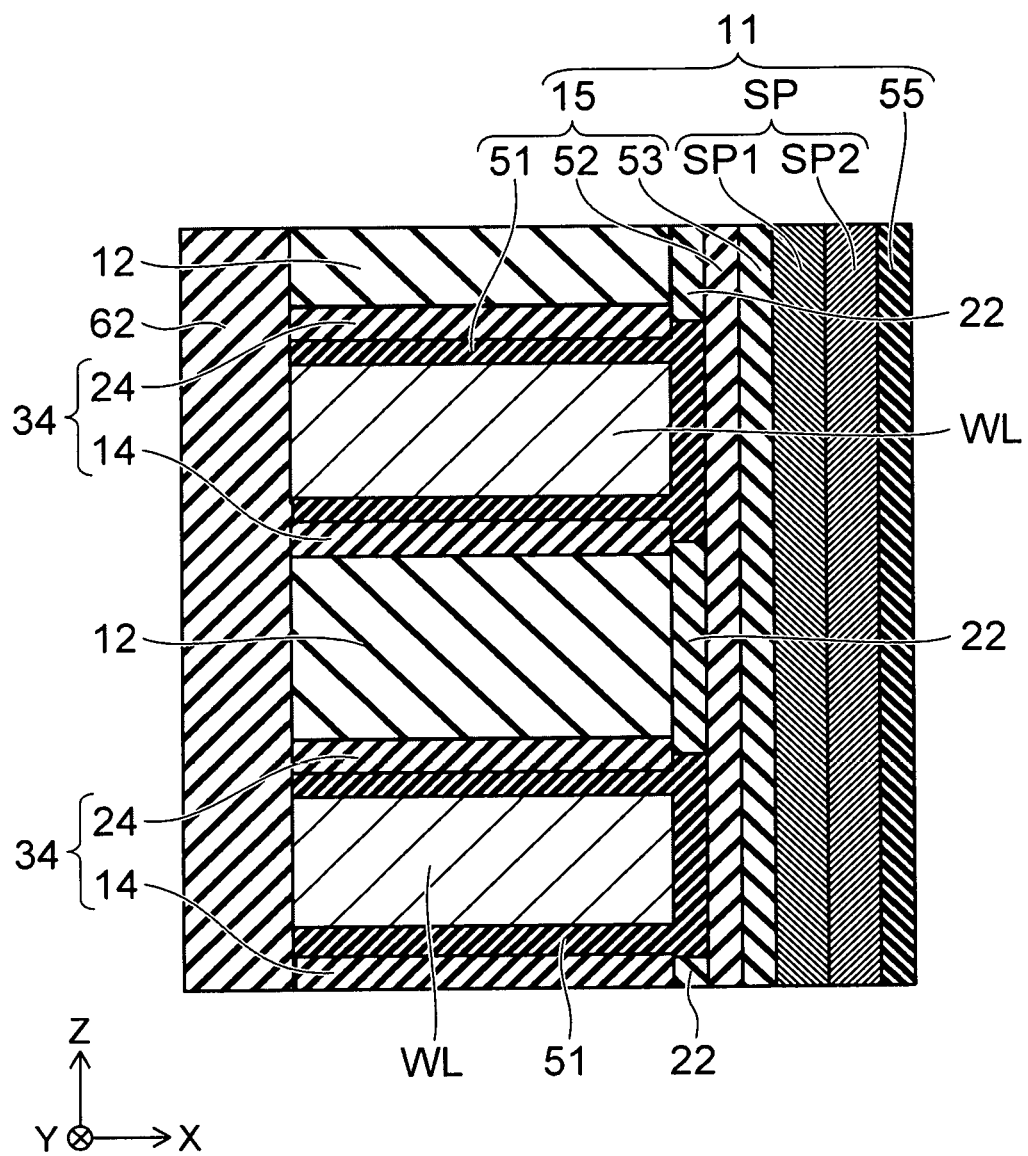
FIG. 3 is a cross-sectional view illustrating a region B illustrated in FIG. 2.

FIG. 3 is a cross-sectional view illustrating a region B illustrated in FIG. 2.

As illustrated in FIG. 3, the pillar 11 is composed of a cover film 22, a memory film 15, a silicon pillar SP, and a core part 55. The cover film 22 is provided on that portion of the pillar 11 which is in contact with the insulating film 12 and the silicon containing film 34. The cover film 22 is provided between the pillar 11 and one of the insulating films 12. A block insulating film 51 is provided on that portion of the pillar 11 which is in contact with the word line WL, and on that portion of the pillar 11 which is in contact with the silicon containing film 34. The block insulating film 51 is also provided between the silicon containing film 34 and the word line WL. A charge storage film 52 is provided on side surfaces of the cover film 22 and the block insulating film 51 which face a memory hole MH. A tunnel insulating film 53 is provided on a side surface of the charge storage film 52.

A stacked film composed of the block insulating film 51, the charge storage film 52 and the tunnel insulating film 53 is referred to as the memory film 15. The block insulating film 51 does not substantially permit a current to flow through even when the block insulating film 51 is applied with a voltage within the range of the driving voltage for the semiconductor device 1. The charge storage film 52 is capable of storing charge. The tunnel insulating film 53 is normally insulative, but permits a tunnel current to flow through when the charge storage film 52 is applied with a predetermined voltage within the range of the driving voltage for the semiconductor device 1.

The silicon pillar SP is provided on a side surface of the tunnel insulating film 53. The silicon pillar SP is composed of an outer silicon pillar SP1 that is in contact with the tunnel insulating film 53 and an inner silicon pillar SP2 provided on a side surface of the silicon pillar SP1. The silicon pillar SP includes a first portion (the outer silicon pillar SP1, for example) and the second portion (the inner silicon pillar SP2, for example). The first portion is provided between the second portion and the memory film 15. The core part 55 is provided at a central axis portion of the pillar 11 in such a way as to come into contact with a side surface of the silicon pillar SP2.

As illustrated in FIG. 2, the insulating film 38 is provided on the insulating film 37 and the upper selection gate electrode USG. A plate-like source line SL, which extends along a Y-Z plane from the insulating film 16 to the insulating film 38, is provided on the substrate 10. The source line SL is connected to the substrate 10. An insulating member 18 is provided between the source line SL and the stacked body 13, extending from the insulating film 16 to the insulating film 38. The source line SL and the insulating member 18 also extend in the Y-direction. A plurality of stacked bodies 13 and a plurality of source lines SL are provided, and are alternately disposed along the X-direction. The source lines SL may be provided on an upper layer portion of the substrate 10.

The insulating film 39 is provided on the insulating film 38, the insulating member 18 and the source line SL. A contact plug CP buried in the insulating film 38 and the insulating film 39 is provided on the pillar 11. The bit lines BL isolated from one another in the Y-direction and extending in the X-direction are provided on the contact plugs CP.

The substrate 10 is formed of a semiconductor material containing, for example, silicon (Si). The insulating film 12 is formed of, for example, silicon oxide ($SiO_2$). The silicon containing film 34 is formed of silicon nitride ($Si_3N_X$) where X is, for example, less than four. The cover film 22 is formed of, for example, silicon oxide. The charge storage film 52 is formed of, for example, silicon nitride ($Si_3N_4$). The tunnel insulating film 53 is formed of, for example, silicon oxide. The silicon pillar SP contains, for example, silicon. The core part 55 is formed of, for example, silicon oxide. The source lines SL and bit lines BL are formed of a conductive material.

Next, a manufacturing method for the semiconductor device according to the embodiment will be described.

Figure 4A:
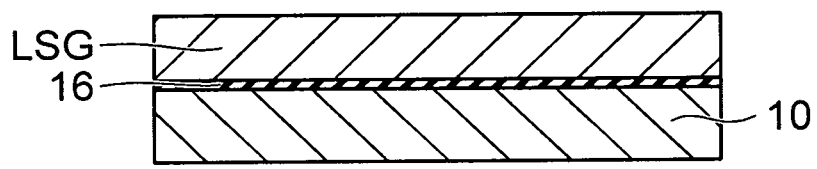
FIGS. 4A and 4B are cross-sectional views illustrating a method for manufacturing the semiconductor device according to the embodiment.
Figure 4B:
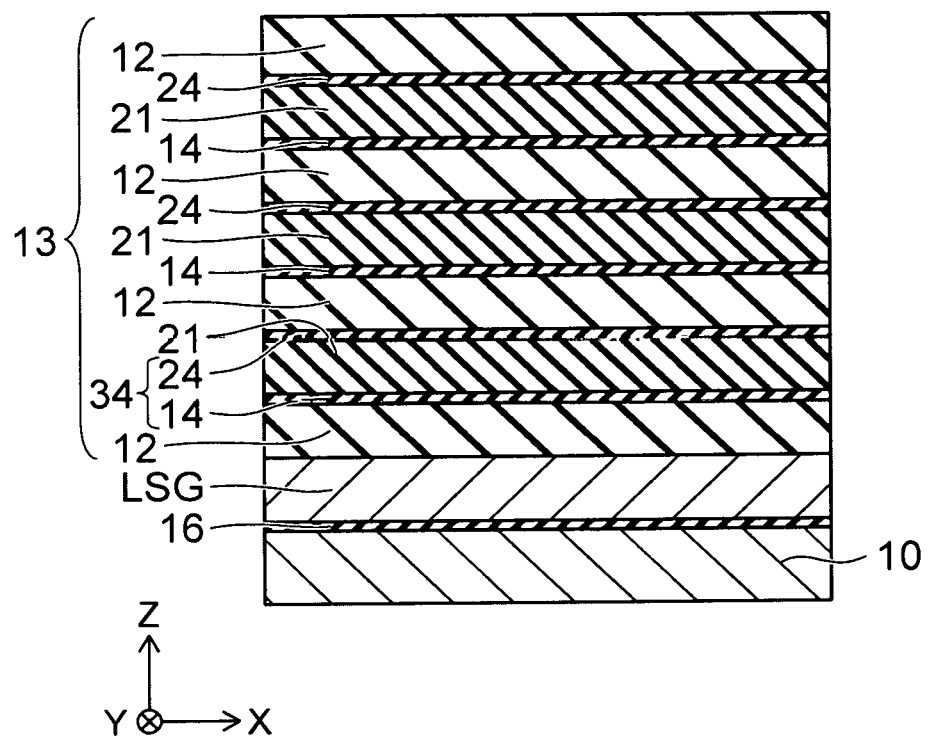

FIGS. 4A and 4B are cross-sectional views illustrating a method for manufacturing the semiconductor device according to the embodiment.

As illustrated in FIG. 4A, the insulating film 16 formed of silicon oxide is formed on the substrate 10 by, for example, high density plasma chemical vapor deposition (HDP-CVD). The lower selection gate electrode LSG is formed on the insulating film 16.

Next, as illustrated in FIG. 4B, the insulating film 12, the first silicon containing film 14, a filing film 21, and the second silicon containing film 24 are repeatedly stacked in the named order on the lower selection gate electrode LSG, thereby forming the stacked body 13. The processes of forming the stacked body 13 will be described below.

Figure 5A:
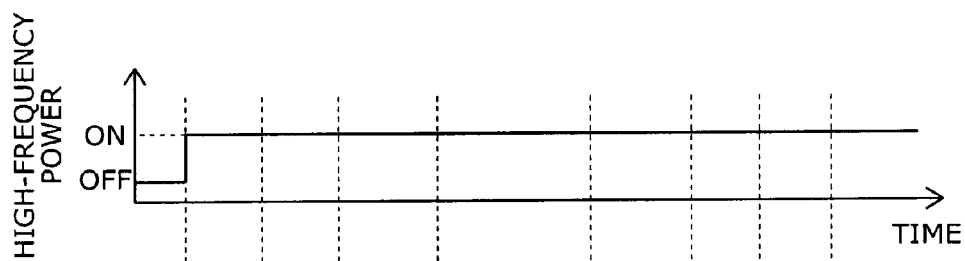
FIG. 5A is a graph showing a change in high-frequency power in the manufacture of the semiconductor device according to the embodiment, the abscissa representing the time while the ordinate represents the high-frequency power.

FIG. 5A is a graph showing a change in high-frequency power in the manufacture of the semiconductor device according to the embodiment, the abscissa representing the time while the ordinate represents the high-frequency power.

Figure 5B:
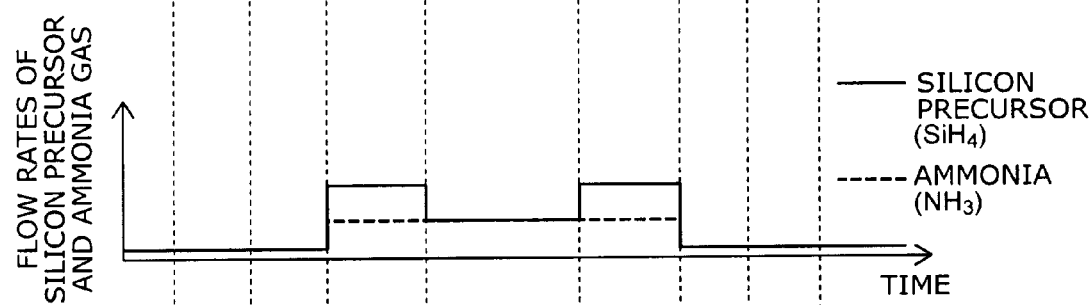
FIG. 5B is a graph showing changes in the flow rates of a silicon precursor and ammonia gas in the manufacture of the semiconductor device according to the embodiment, the abscissa representing the time while the ordinate represents the gas flow rates.

FIG. 5B is a graph showing changes in the flow rates of a silicon precursor and ammonia gas in the manufacture of the semiconductor device according to the embodiment, the abscissa representing the time while the ordinate represents the gas flow rates.

Figure 5C:
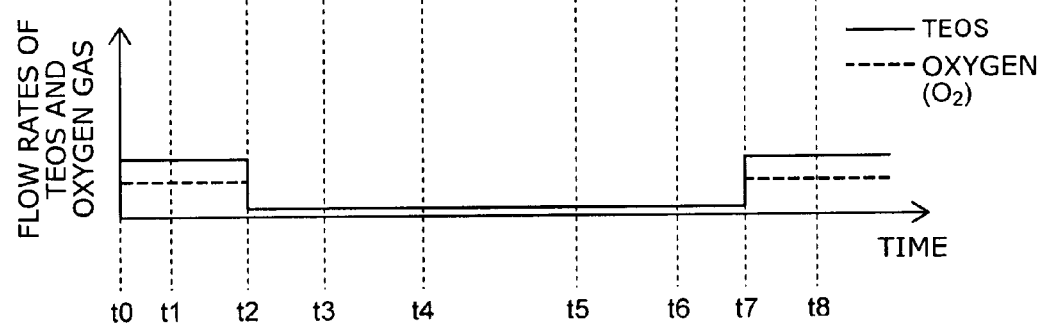
FIG. 5C is a graph showing changes in the flow rates of TEOS and oxygen in the manufacture of the semiconductor device according to the embodiment, the abscissa representing the time while the ordinate represents the gas flow rates.

FIG. 5C is a graph showing changes in the flow rates of TEOS and oxygen in the manufacture of the semiconductor device according to the embodiment, the abscissa representing the time while the ordinate represents the gas flow rates.

The times shown on the abscissae in FIGS. 5A to 5C are synchronous with one another. The following description referring to FIGS. 5A to 5C relates to phenomena in the chamber of a plasma chemical vapor deposition (PCVD) apparatus.

A standby period P01 from time t0 to time t1 shown in FIGS. 5A to 5C is a period for preparing for formation of the insulating film 12 on the lower selection gate electrode LSG.

A mixed gas of TEOS ($Si(OC_2H_5)_4$) and oxygen ($O_2$) is used in the standby period P01. High-frequency power RF is not applied to the mixed gas.

An insulating-film-12 formation period P12 from time t1 to time t2 is a period for forming the insulating film 12 on the lower selection gate electrode LSG. For example, silicon oxide is deposited by PCVD to form the insulating film 12. Specifically, a mixed gas of TEOS ($Si(OC_2H_5)_4$) and oxygen ($O_2$) is used in the insulating-film-12 formation period P12. Further, high-frequency power RF is applied to the mixed gas. This causes plasma discharge in the atmosphere of the mixed gas containing TEOS and oxygen, so that silicon oxide is deposited on the lower selection gate electrode LSG to form the insulating film 12.

A purge period P23 from time t2 to time t3 is a period for sustaining plasma generated in the period P12. The purge period P23 is also a period for purging the chamber of a process gas. For example, nitrogen ($N_2$) or a noble gas such as argon (Ar) or helium (He) is introduced. At this time, the high-frequency power RF remains ON.

A first-silicon containing-film-14 formation period P34 from time t3 to time t4 is a period for forming the first silicon containing film 14 on the insulating film 12. In the first-silicon containing-film 14 formation period P34, a mixed gas of silicon precursor ($SiH_4$) and ammonia ($NH_3$) is used. The flow rate of the silicon precursor is set greater than the flow rate of ammonia. The high-frequency power RF remains ON. This causes plasma discharge in the atmosphere of the mixed gas containing the silicon precursor gas and ammonia gas, so that silicon oxide ($Si_3N_X$) where X is, for example, less than 4 is deposited on the insulating film 12 to form the first silicon containing film 14.

A filing-film-21 formation period P45 from time t4 to time t5 is a period for forming the filing film 21. The high-frequency power RF is kept applied to the mixed gas in the period P45, so that silicon nitride is deposited on the first silicon containing film 14 to form the filing film 21. The ratio of the flow rate of the silicon precursor gas to the flow rate of the ammonia gas in the period P45 is set less than the ratio of the flow rate of the silicon precursor gas to the flow rate of the ammonia gas in the period P34. Accordingly, the silicon content in the filing film 21 per unit volume becomes less than the silicon content in the first silicon containing film 14 per unit volume.

A second-silicon containing-film-24 formation period P56 from time t5 to time t6 is a period for forming the second silicon containing film 24 on the filing film 21. The high-frequency power RF is kept applied to the mixed gas in period P56, so that plasma discharge occurs in the atmosphere of the mixed gas containing the silicon precursor gas and ammonia gas to deposit silicon oxide ($Si_3N_X$) where X is, for example, less than 4 on the filing film 21, thereby forming the second silicon containing film 24. The ratio of the flow rate of the silicon precursor gas to the flow rate of the ammonia gas in the period P56 is set greater than the ratio of the flow rate of the silicon precursor gas to the flow rate of the ammonia gas in the period P45. Accordingly, the silicon content in the second silicon containing film 24 per unit volume becomes larger than the silicon content in the filing film 21 per unit volume.

A purge period P67 from time t6 to time t7 is a period for sustaining plasma generated in the period P56, and a noble gas similar to the one introduced in the period P23 is introduced in the period P67. The purge period P67 is also a period for purging the chamber of a process gas. At this time, the high-frequency power RF remains ON.

An insulating-film-12 formation period P78 from time t7 to time t8 is a period for forming the insulating film 12 on the second silicon containing film 24. A method of forming the insulating film 12 in the period P78 is similar to the method of forming the insulating film 12 in the period P12.

After the period P78, the above-described periods P12 to P67 are repeated to form the stacked body 13.

FIGS. 6 to 18 are cross-sectional views illustrating the method of manufacturing the semiconductor device according to the embodiment. What is illustrated in FIG. 8 is equivalent to a region B illustrated in FIG. 7. What is illustrated in FIGS. to 16 are equivalent to a region B illustrated in FIG. 9.

Figure 6:
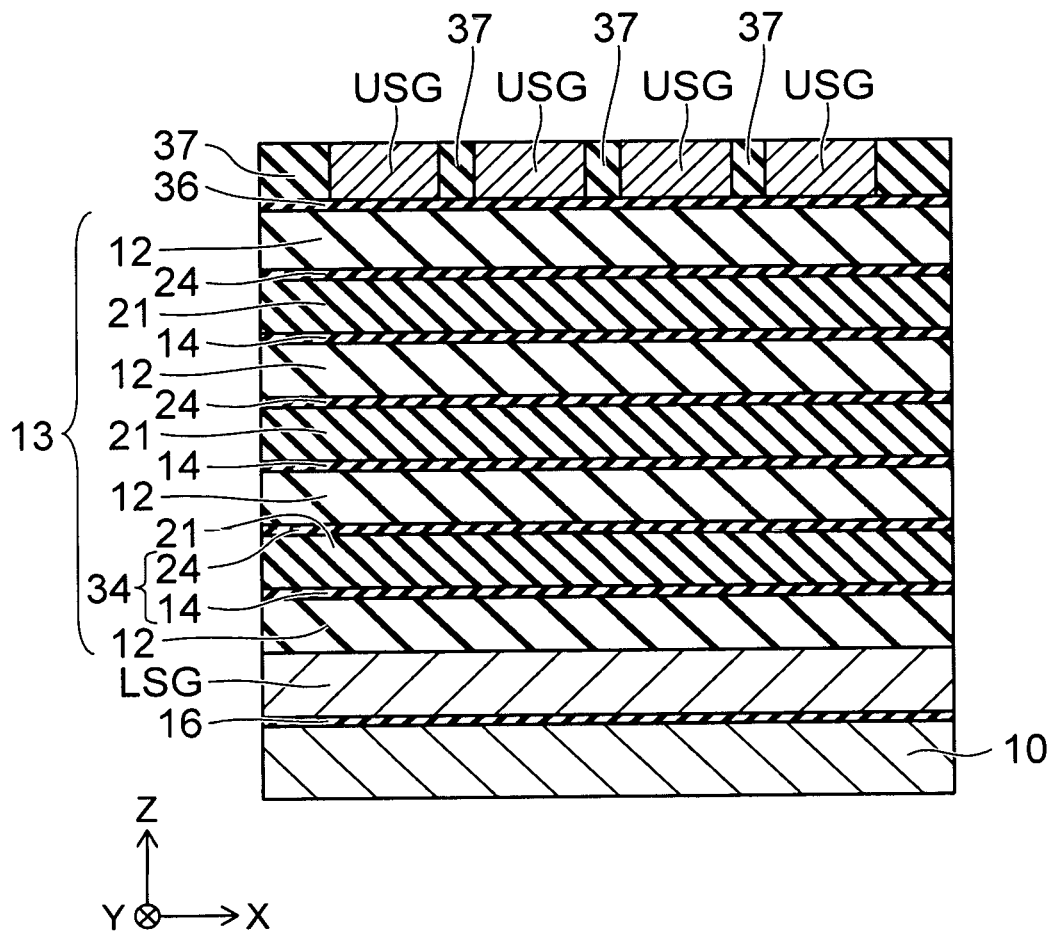
FIGS. 6 to 18 are cross-sectional views illustrating the method of manufacturing the semiconductor device according to the embodiment.

As illustrated in FIG. 6, the insulating film 36 is formed on the stacked body 13. Then, the upper selection gate electrodes USG extending in the Y-direction and isolated in the X-direction are formed on the insulating film 36. A space between the upper selection gate electrodes USG is filled with the insulating film 37.

Figure 7:
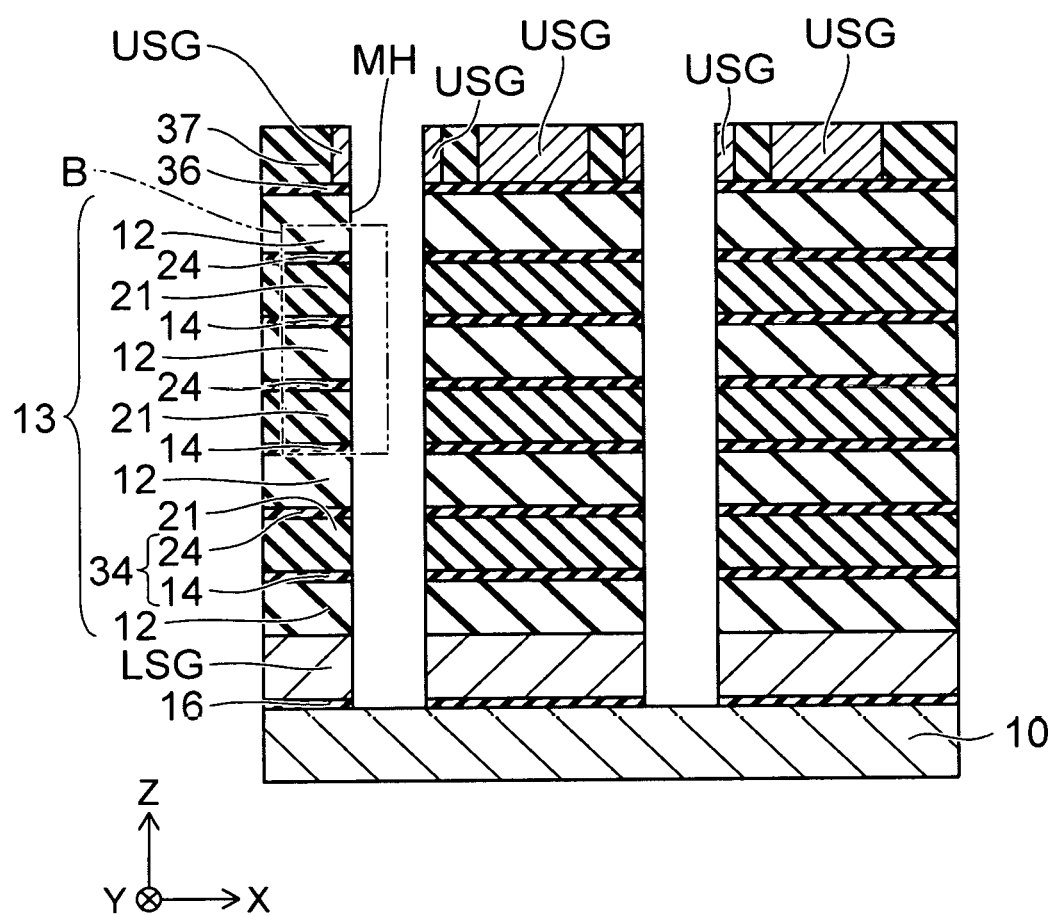
Figure 8:
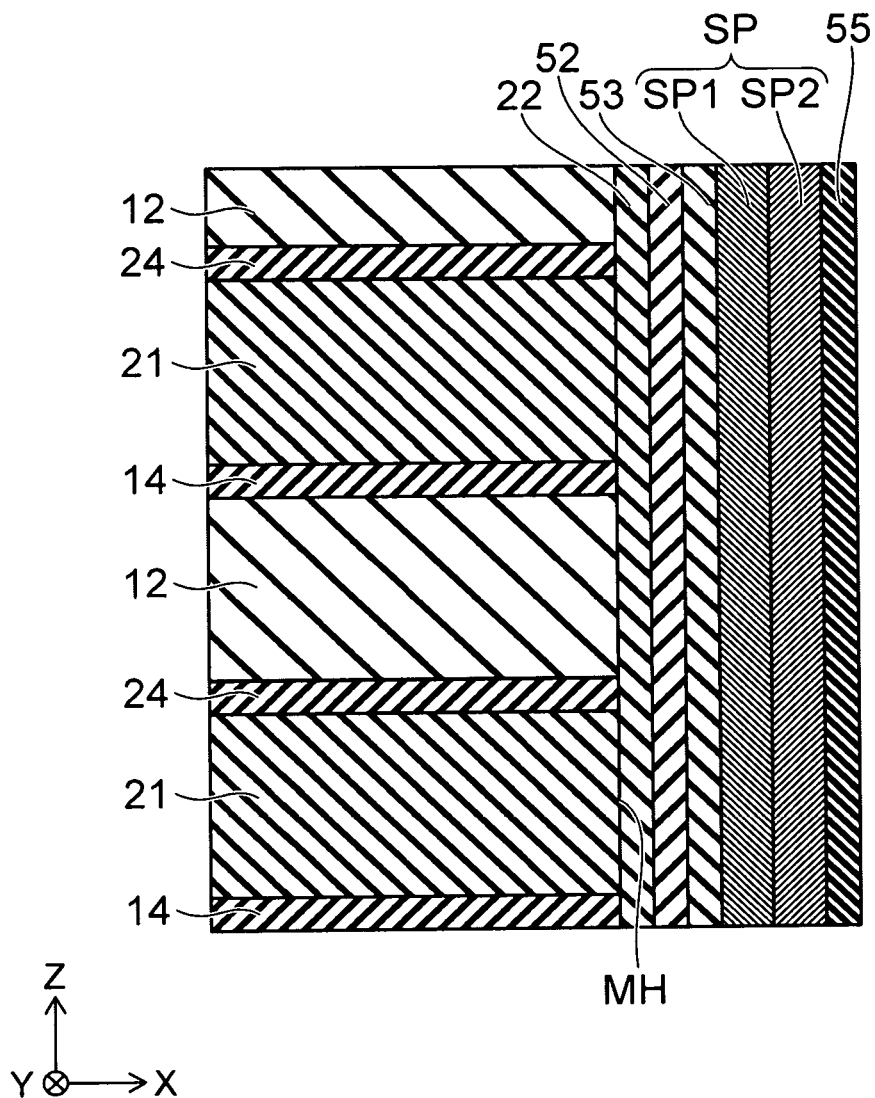

Next, as illustrated in FIG. 7, reactive ion etching (RIE), for example, is performed to form the memory hole MH penetrating in the Z-direction from the upper selection gate electrode USG to the insulating film 16.

Then, as illustrated in FIG. 8, silicon oxide, for example, is deposited on a side surface of the memory hole MH by chemical vapor deposition (CVD) to form the cover film 22. Silicon nitride, for example, is deposited on a side surface of the cover film 22 to form the charge storage film 52. Silicon oxide, for example, is deposited on a side surface of the charge storage film 52 to form the tunnel insulating film 53. The silicon pillar SP1 is formed on a side surface of the tunnel insulating film 53. Next, anisotropic etching such as RIE is performed. As a result, the substrate 10 is exposed at the bottom surface of the memory hole MH. At this time, the tunnel insulating film 53 is protected by the silicon pillar SP1, so that the tunnel insulating film 53 can be prevented from being damaged by etching. Next, the silicon pillar SP2 is formed on the inner surface of the memory hole MH. The silicon pillar SP2 comes into contact with the substrate 10. The silicon pillar SP1 and the silicon pillar SP2 contain silicon, for example. A material containing, for example, silicon oxide is buried in the central axis portion of the silicon pillar SP1 or the silicon pillar SP2 to form the core part 55.

Figure 9:
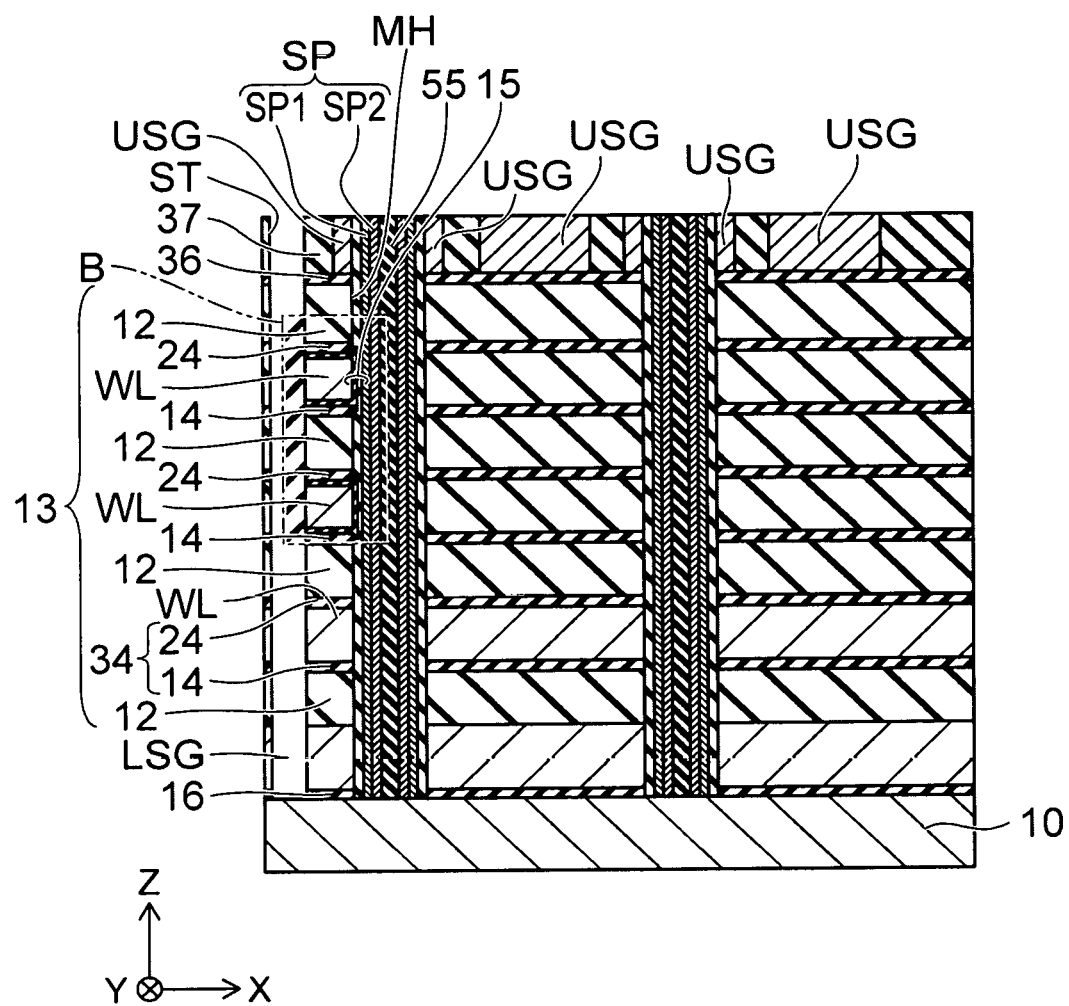

Then, as illustrated in FIG. 9, RIE, for example, is performed on the side portion of the silicon pillar SP to form a slit ST penetrating in the Z-direction from the insulating film 37 to the insulating film 16. The slit ST extends in the Y-direction.

Figure 10:
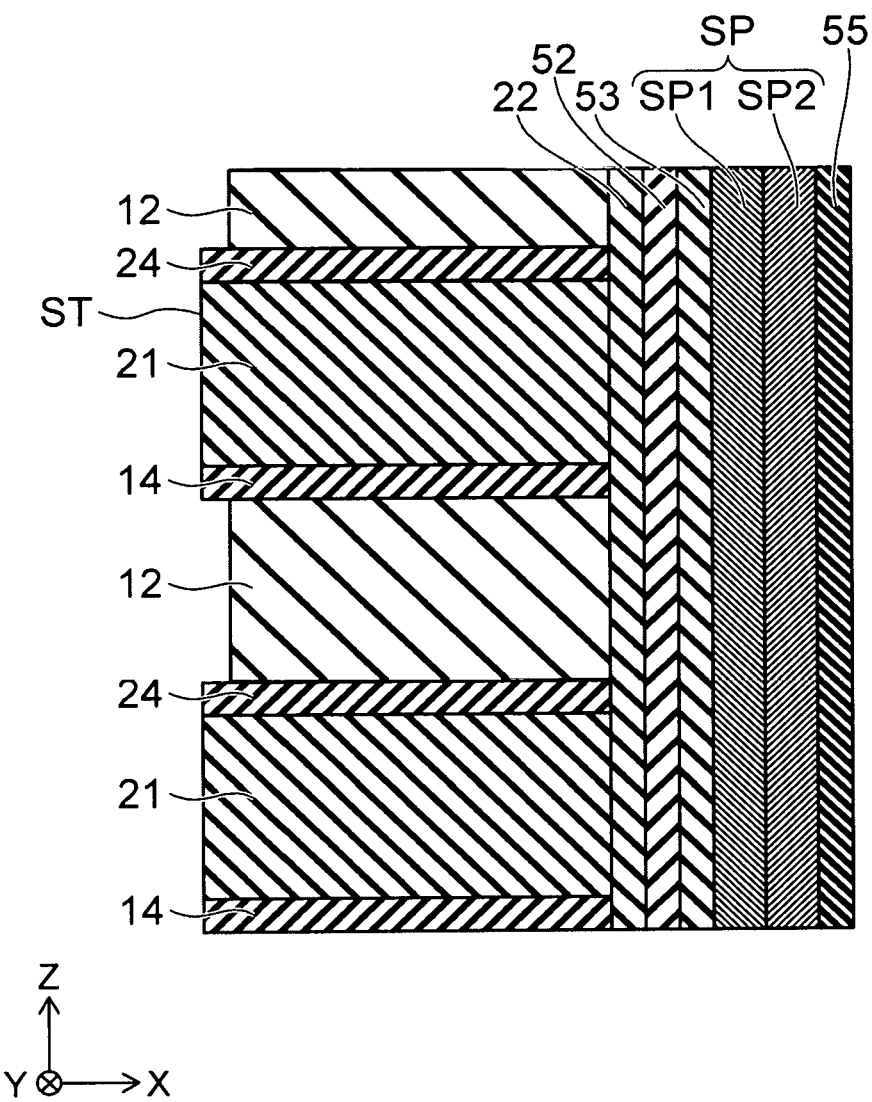

Then, as illustrated in FIG. 10, the side surface of the slit ST is cleaned by diluted hydrofluoric acid (DHF). As a result, the surface of the insulating film 12 that is exposed within the slit ST recedes.

Figure 11:
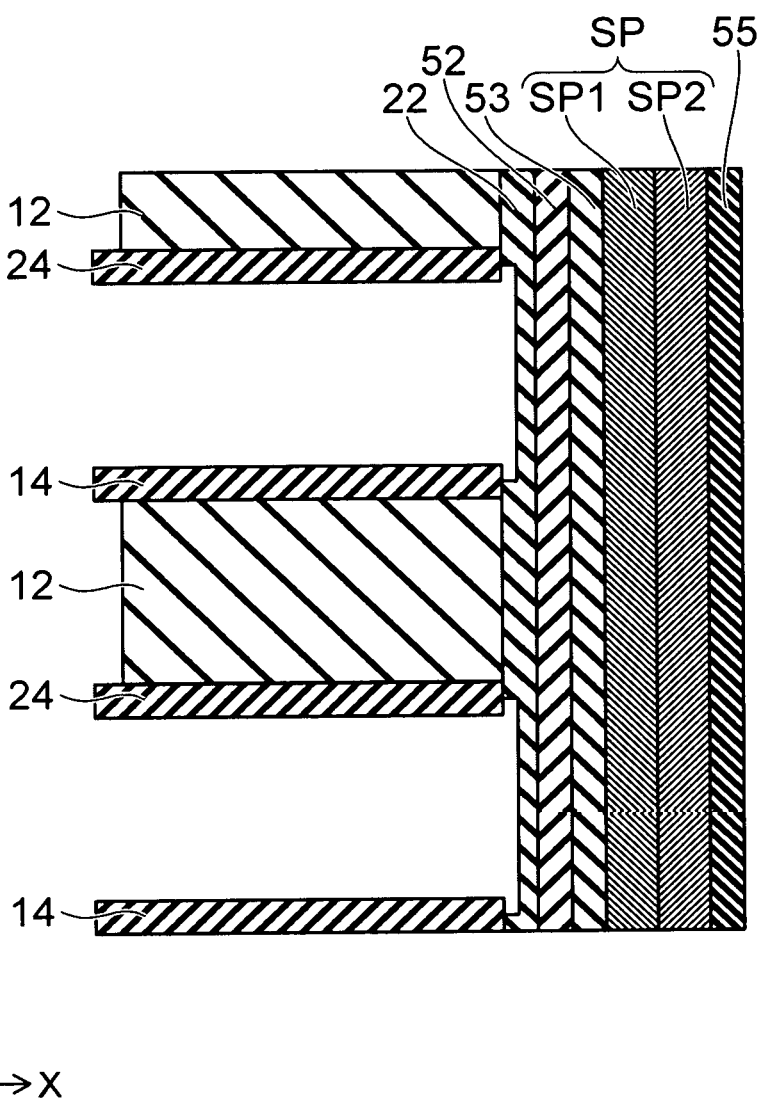

Then, as illustrated in FIG. 11, wet etching using, for example, hot phosphoric acid ($H_3PO_4$) as an etchant is performed to remove the filing film 21 through the slit ST. Both of the silicon containing film 34 and the filing film 21 contain silicon (Si) and nitride (N). Since the silicon concentration of the silicon containing film 34 is higher than the silicon concentration of the filing film 21, the etching rate of the silicon containing film 34 becomes lower than the etching rate of the filing film 21 when hot-phosphoric-acid based wet etching is performed.

Wet etching removes the filing film 21, but does not remove the silicon containing film 34 much, so that the silicon containing film 34 remains. Since the top surface and bottom surface of the insulating film 12 are covered with the silicon containing film 34, hot phosphoric acid does not cause those top surface and bottom surface to recede. This suppresses a variation in the Z-directional thickness of the insulating film 12 after wet etching.

Further, hot phosphoric acid removes a part of the portion of the cover film 22 that is in contact with the filing film 21.

Figure 12:
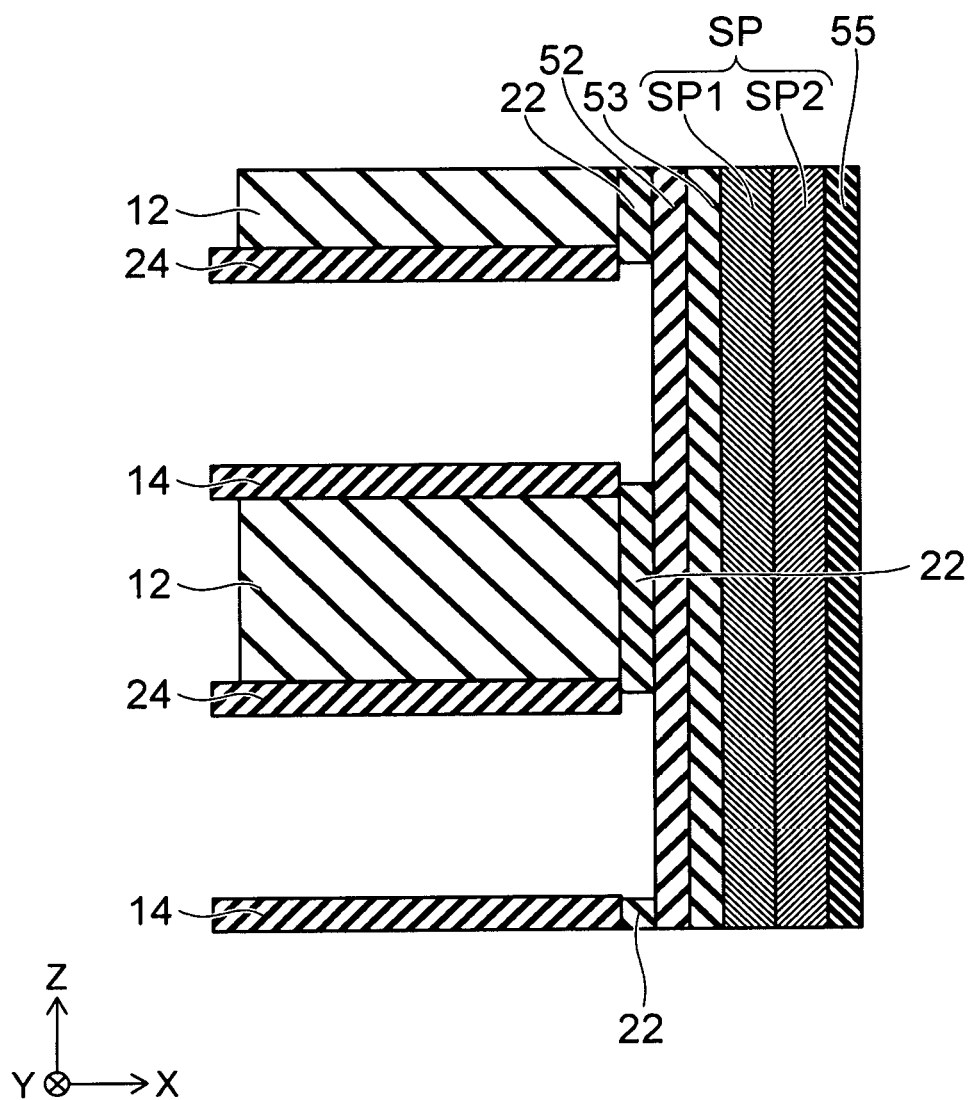

Next, as illustrated in FIG. 12, a portion of the cover film 22 that faces the space provided after removal of the filing film 21 is cleaned by DHF through the slit ST. This causes receding of the surface of the cover film 22 that is exposed to the space provided after removal of the filing film 21.

Figure 13:
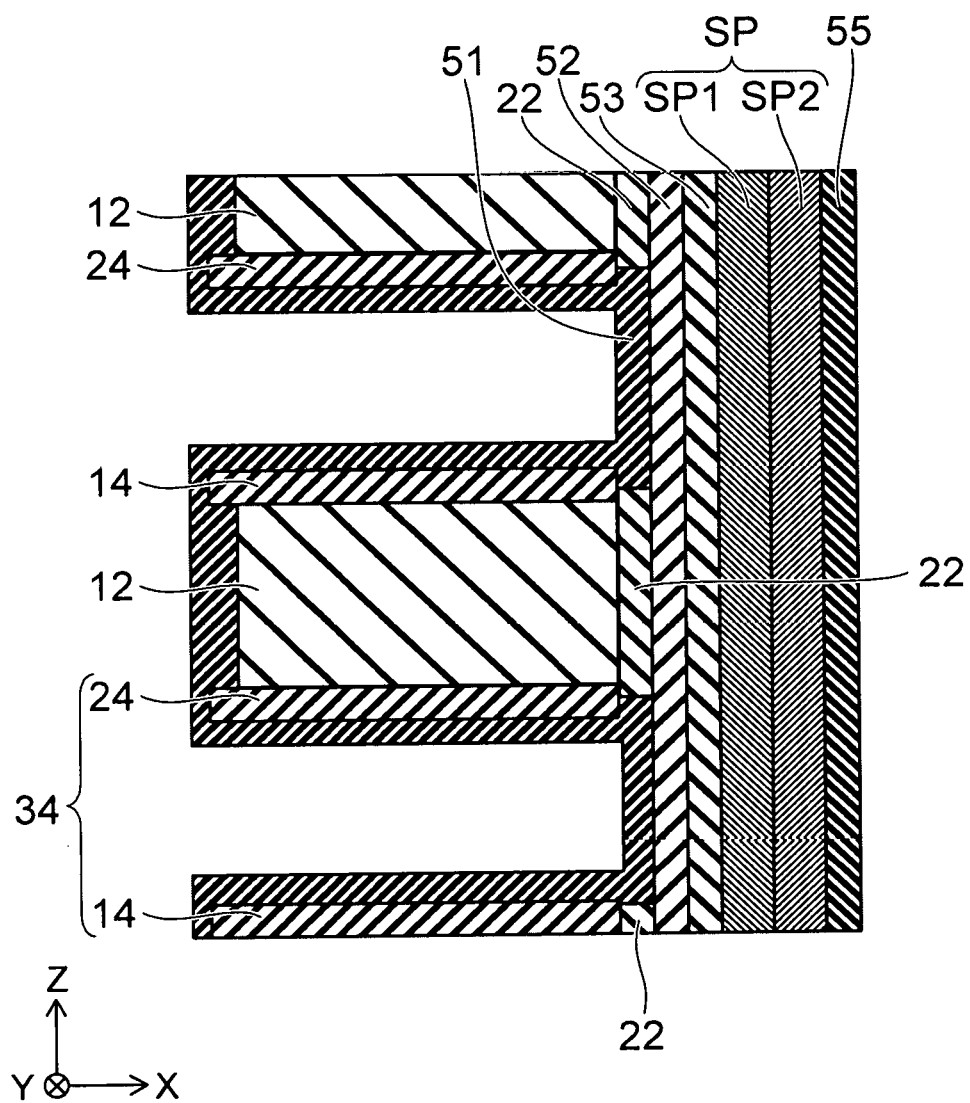

Next, as illustrated in FIG. 13, the block insulating film 51 is formed on the surfaces of the insulating film 12, the silicon containing film 34 and the cover film 22 through the slit ST.

Figure 14:
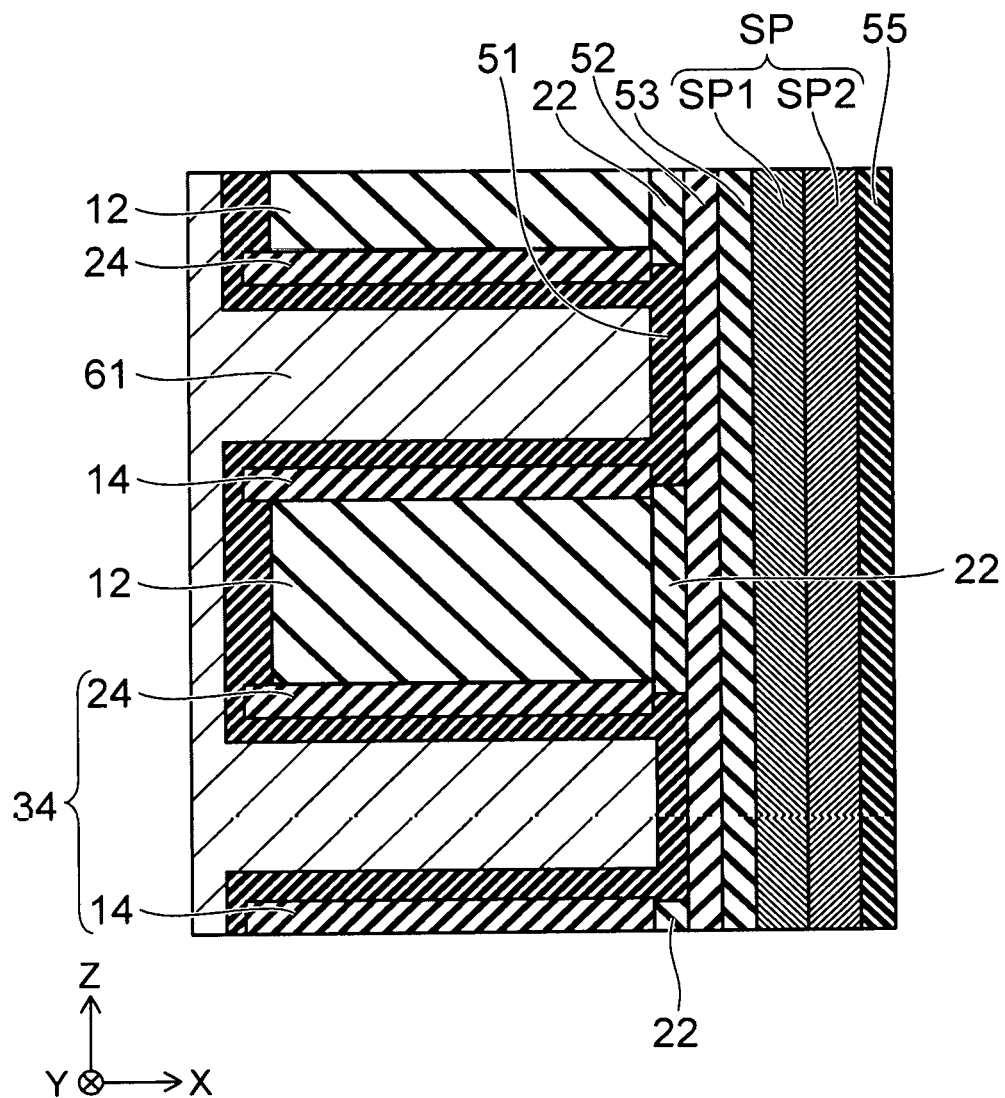

Then, as illustrated in FIG. 14, the space on the surface of the block insulating film 51 provided after removal of the filing film 21 is filled with a conductive material such as tungsten (W) through the slit ST to from a conductive member 61.

At this time, a variation in the thickness of the insulating films 12 stacked in the Z-direction after wet etching is suppressed in the process illustrated in FIG. 11, so that a variation in the thickness of the conductive member 61 between the first silicon containing film 14 and the second silicon containing film 24 can also be suppressed.

Figure 15:
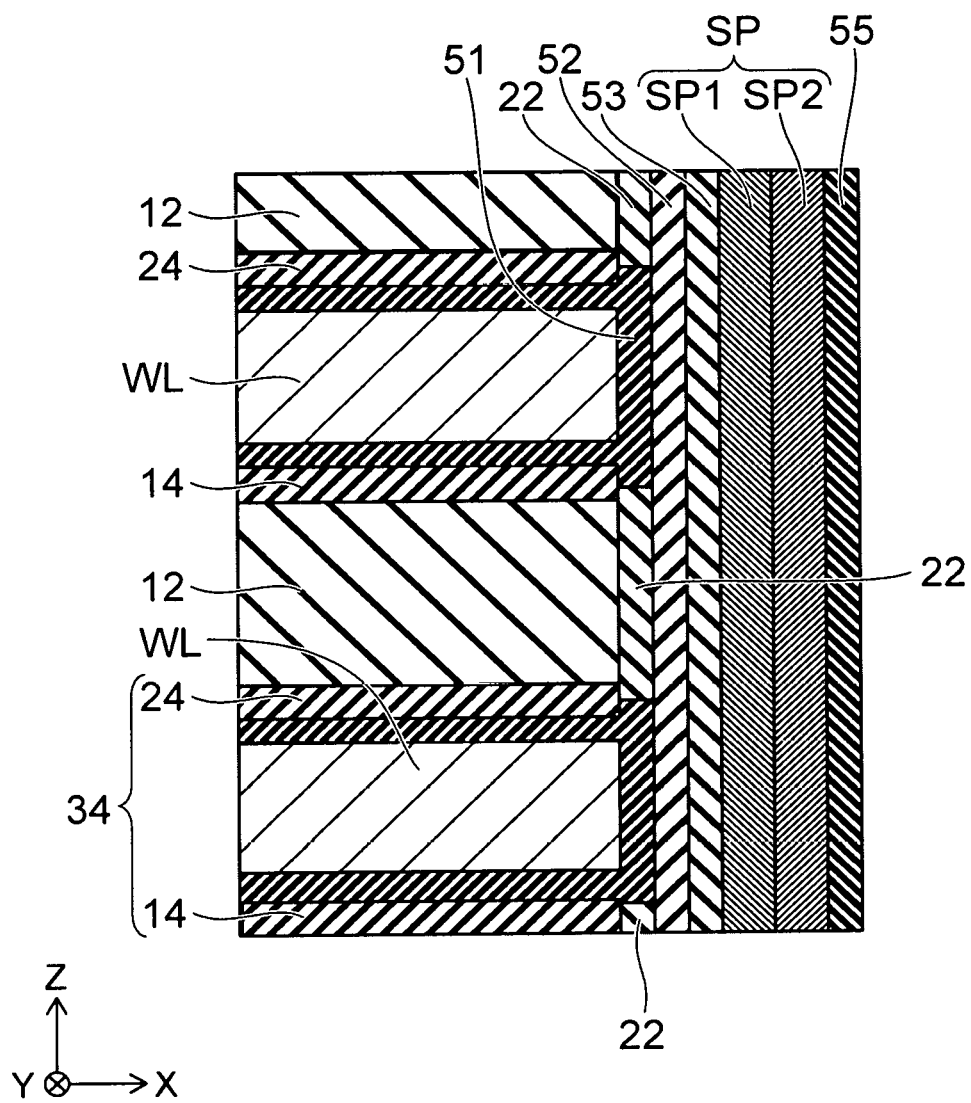

Next, as illustrated in FIG. 15, a portion of the conductive member 61 that faces the slit ST and a portion of the block insulating film 51 that faces the slit ST are removed to form the word lines WL. The word line WL is a portion of the conductive member 61 that is interposed between the first silicon containing film 14 and the second silicon containing film 24. Therefore, a variation in the thickness of the conductive member 61 is suppressed, making it possible to also suppress a variation in the thickness of the word line WL.

Figure 16:
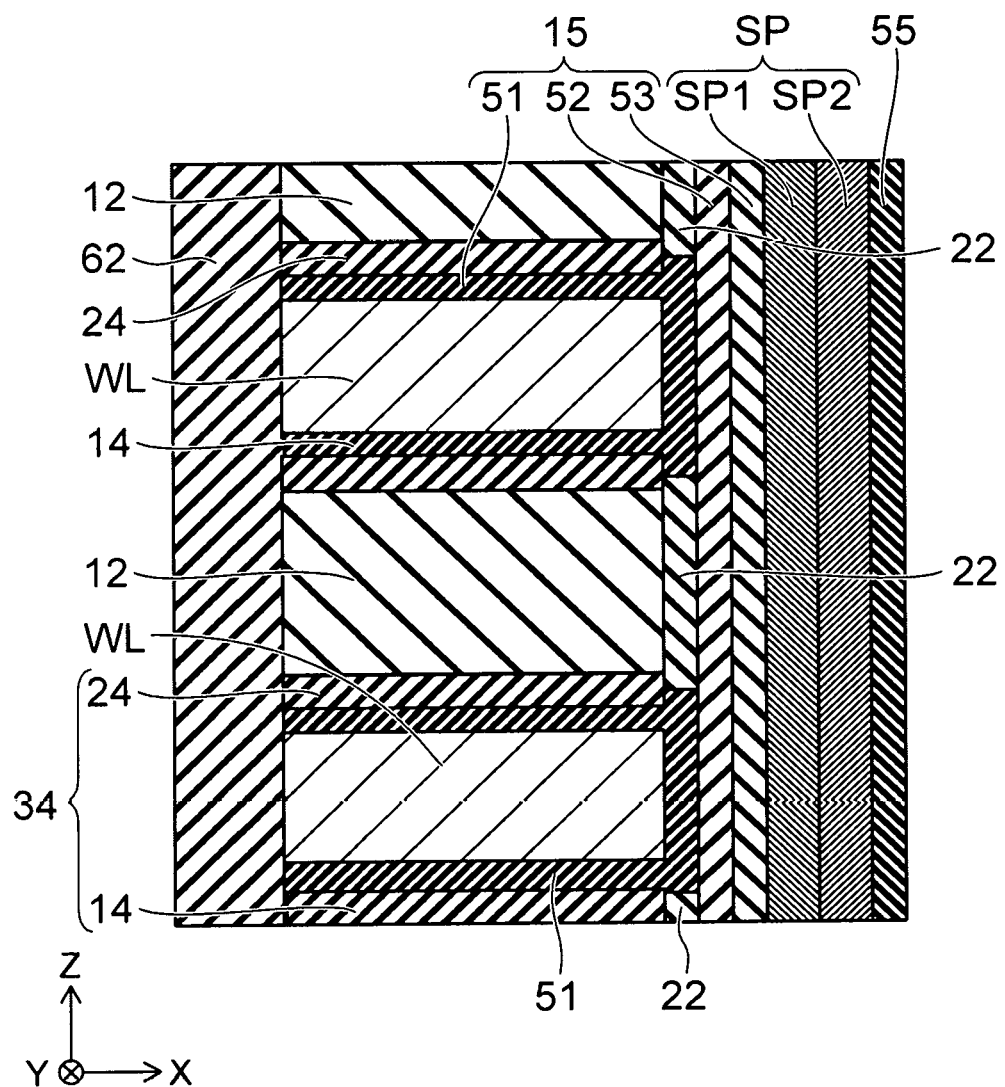

Next, the slit ST is filled with an insulating material to form a conductive member 62 as illustrated in FIG. 16.

Figure 17:
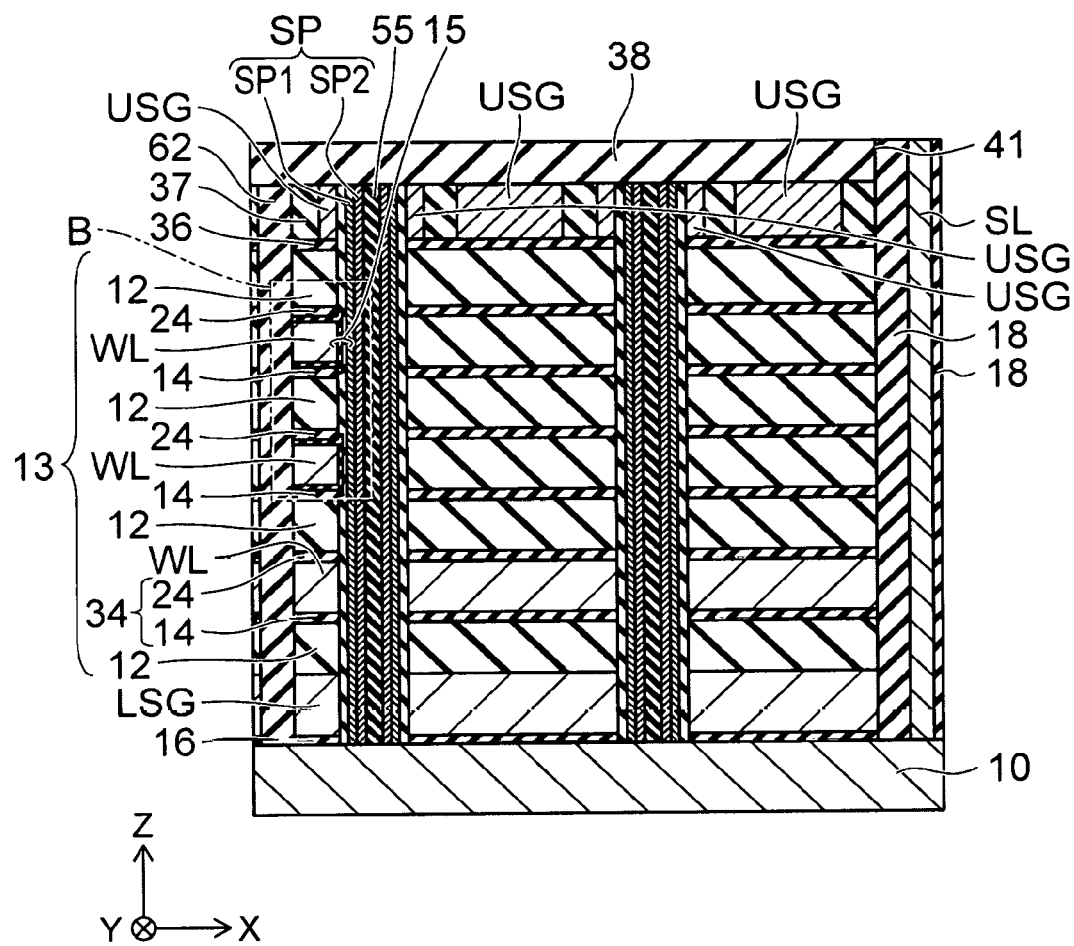

Next, as illustrated in FIG. 17, the insulating film 38 is formed on the insulating film 37, the upper selection gate electrodes USG, and the silicon pillars SP. RIE, for example, is performed on the side portion of the silicon pillar SP to form a slit 41 penetrating in the Z-direction from the insulating film 38 to the insulating film 16. The slit 41 extends in the Y-direction. An insulating material is deposited on the side surface of the slit 41 to form the insulating member 18. The central surface portion of the slit 41 is filled with a conductive material to form the source line SL.

Figure 18:
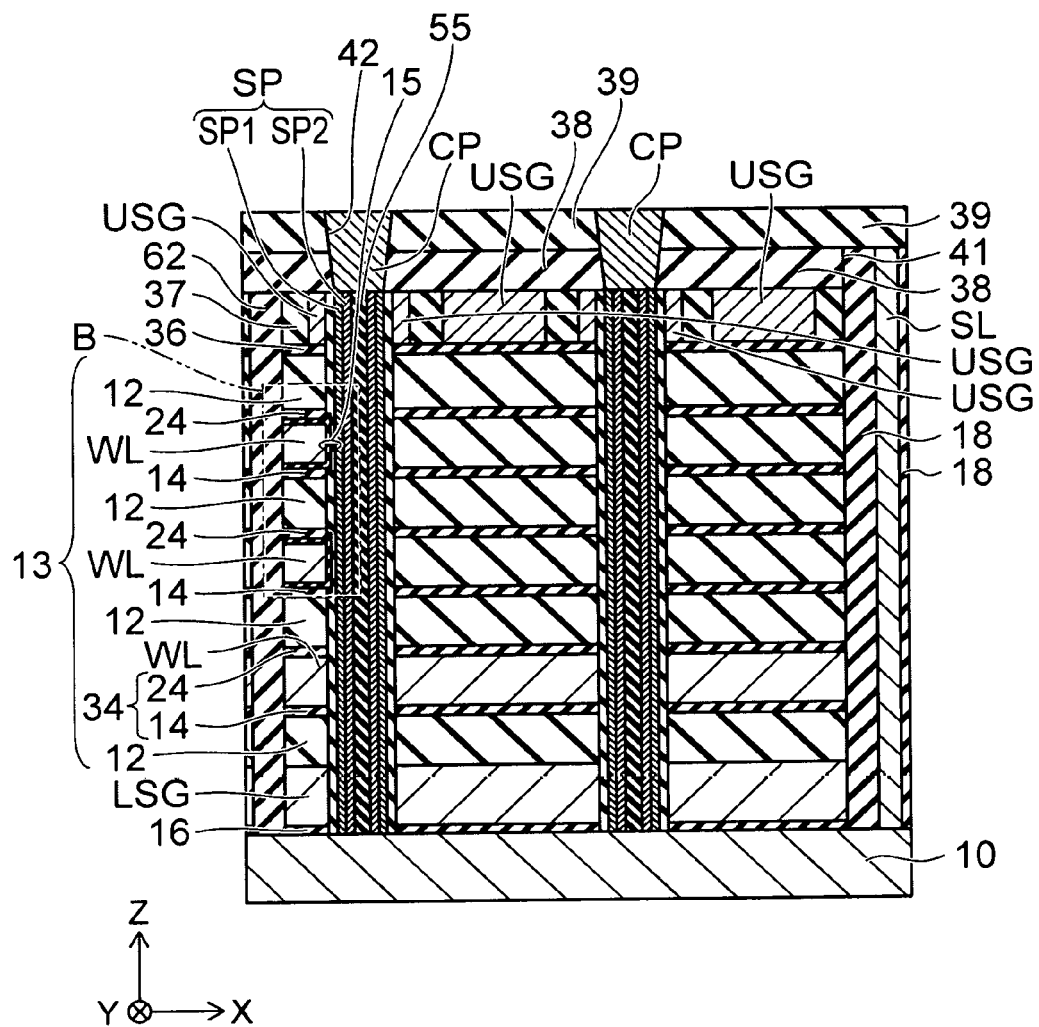

Next, as illustrated in FIG. 18, the insulating film 39 is formed on the top surface of the insulating film 38, the top surface of the insulating member 18, and the top surface the source line SL. RIE is performed above the silicon pillars SP to form contact holes 42 penetrating the insulating film 39 and the insulating film 38 in the Z-direction. Tungsten, for example, is deposited inside the contact holes 42 to form the contact plugs CP.

Next, as illustrated in FIG. 1, the bit lines BL isolated from one another in the Y-direction and extending in the X-direction are provided on the contact plugs CP.

The silicon containing film 34 may be formed by using nitrogen gas (N$_2$) in place of ammonia gas as the mixed gas in the formation of the stacked body 13.

With a mixed gas containing a silicon-precursor gas and an inert gas other than nitrogen gas as the mixed gas in the formation of the stacked body 13, plasma may be discharged in the atmosphere of the mixed gas to form an amorphous silicon film which serves as the silicon containing film 34. In this case, X in the aforementioned composition formula Si$_3$N$_X$ is zero.

The effects of the embodiment will be described.

In the semiconductor device 1 according to the embodiment, the silicon concentration of the silicon containing film 34 is higher than the silicon concentration of the filing film 21. Therefore, when hot-phosphoric-acid based wet etching is performed, the etching rate of the silicon containing film 34 becomes lower than the etching rate of the filing film 21.

Accordingly, wet etching removes the filing film 21, but does not remove the silicon containing film 34 much, causing the silicon containing film 34 to remain. The thickness of the insulating film 12 interposed between the silicon containing films 34 does not substantially vary. Likewise, the thickness of the word line WL that is formed in the space provided after removal of the filing film 21 does not substantially vary.

In other words, since the silicon containing film 34 is not removed much, a variation in the Z-directional thickness of the insulating film 12 is suppressed. The suppressed variation in the Z-directional thickness of the insulating film 12 suppresses a variation in the Z-directional thickness of the word line WL.

In the above-described manner, according to the embodiment, a semiconductor device that suppresses the Z-directional thicknesses of the insulating film 12 and the word line WL and has stable characteristics, and a method for manufacturing such a semiconductor device can be provided.

(Variation)

Figure 19:
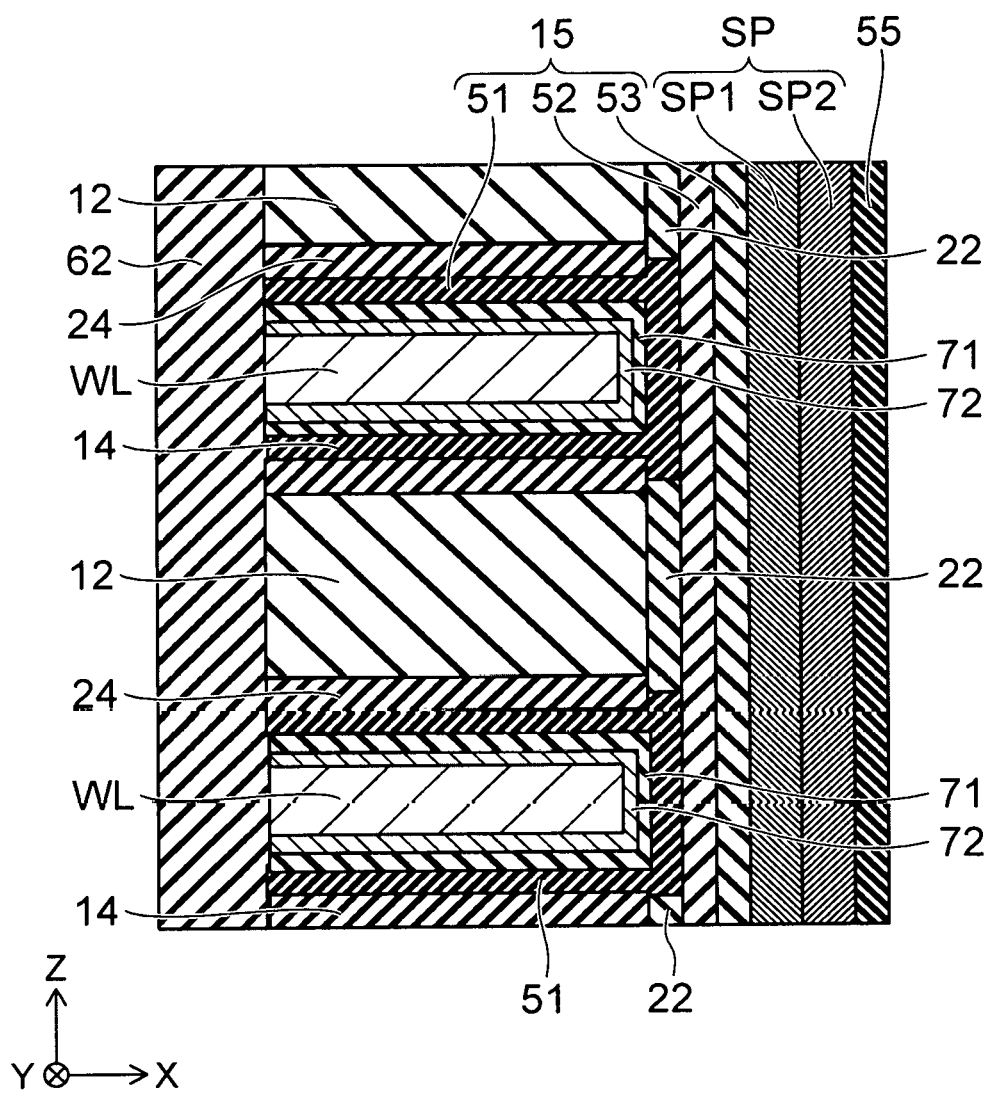
FIG. 19 is a cross-sectional view illustrating a semiconductor device according to a variation of the embodiment.

FIG. 19 is a cross-sectional view illustrating a semiconductor device according to the variation of the embodiment. What is illustrated in FIG. 19 is equivalent to the region B illustrated in FIG. 2.

As illustrated in FIG. 19, the semiconductor device according to the variation differs from the semiconductor device according to the embodiment (see FIG. 3) in the following points (a) and (b).

(a) A block high dielectric film 71 formed of an insulating material and having a high dielectric constant is provided between the memory film 15 and the word line WL.

(b) A barrier metal film 72 containing a metal element to prevent the metal material for the word line WL from being diffused is provided between the block high dielectric film 71 and the word line WL.

Note that the high dielectric is a dielectric having a higher dielectric constant than silicon oxide.

Figure 20:
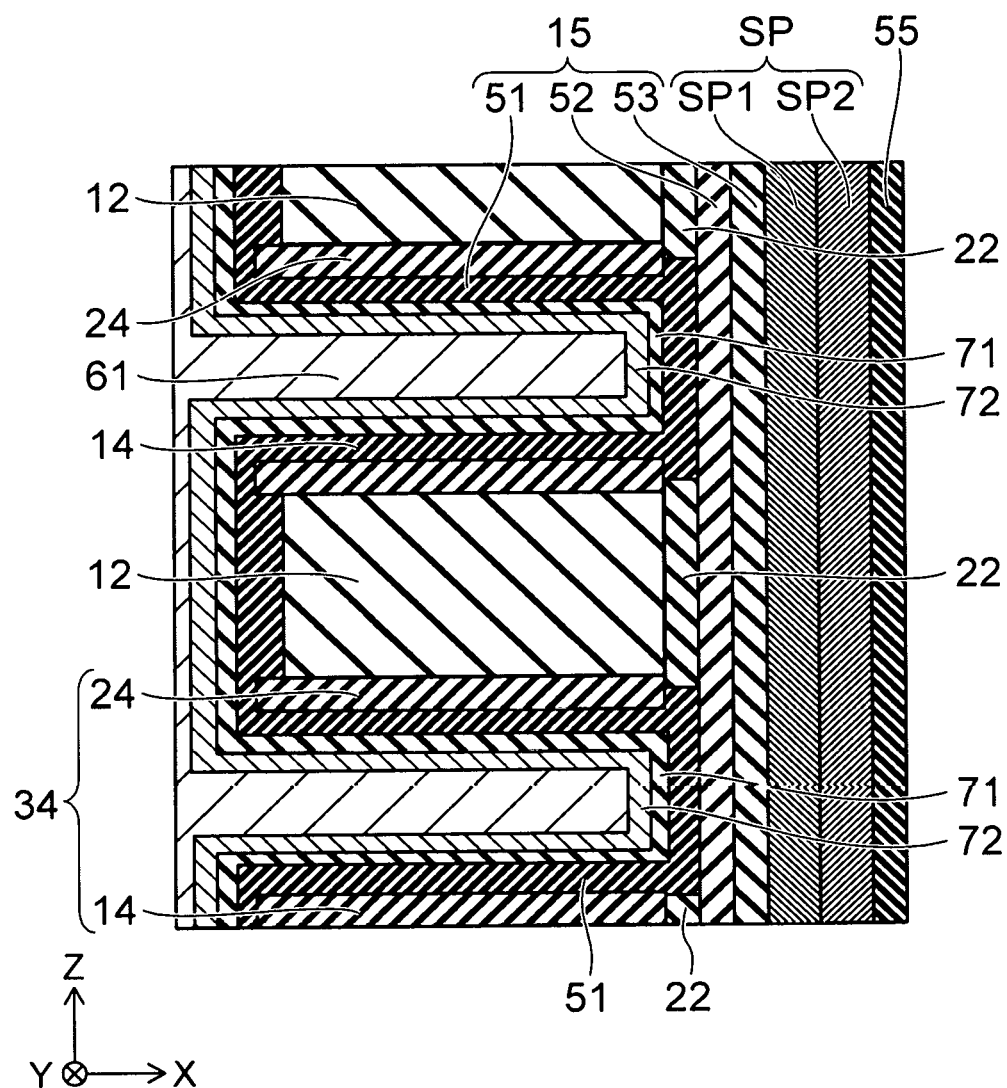
FIGS. 20 and 21 are cross-sectional views illustrating a method of manufacturing the semiconductor device according to the variation of the embodiment.
Figure 21:
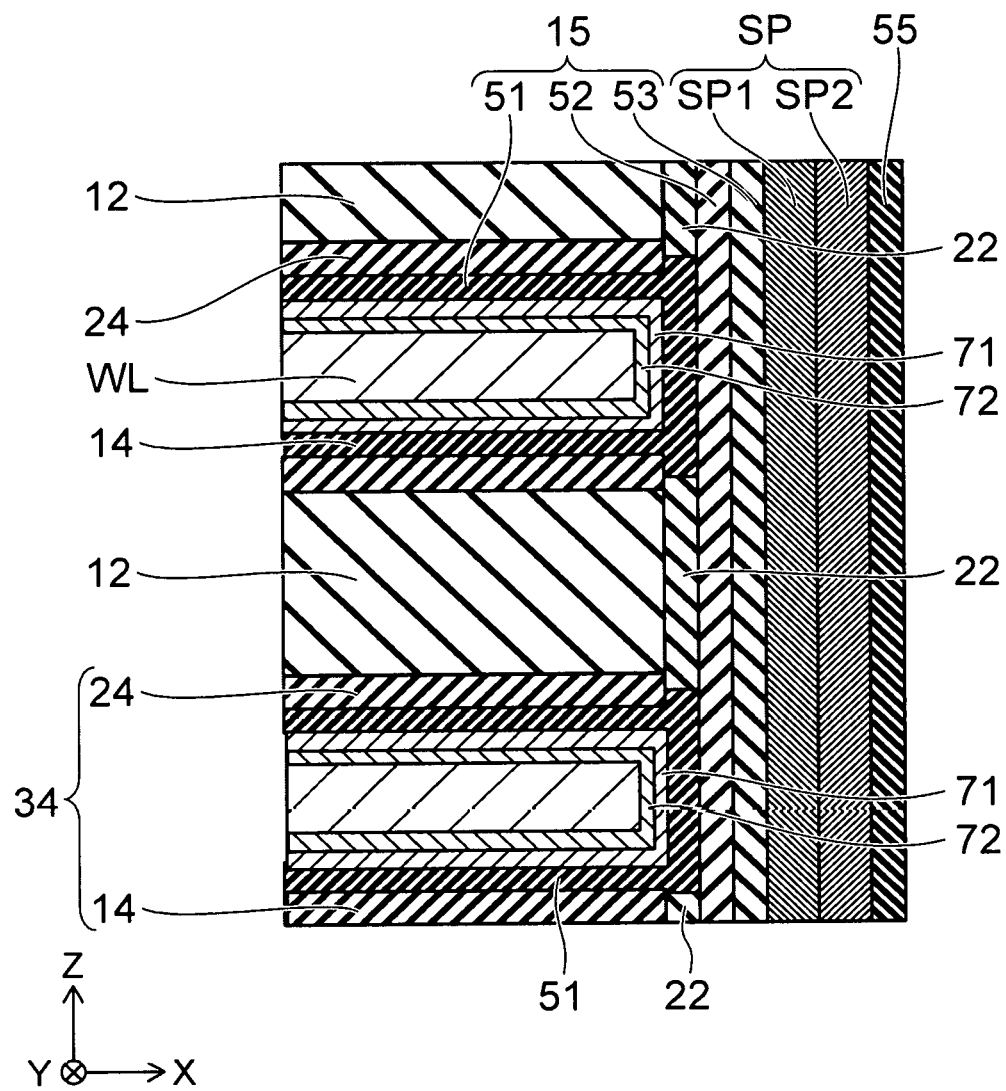

FIGS. 20 and 21 are cross-sectional views illustrating a method of manufacturing the semiconductor device according to the variation of the embodiment. What is illustrated in FIGS. 20 and 21 are equivalent to the region B illustrated in FIG. 9.

This method is similar to the one according to the above-described embodiment up to the formation of the block insulating film 51 (see FIG. 13).

As illustrated in FIG. 20, the block high dielectric film 71 is formed on the surface of the block insulating film 51 through the slit ST. The barrier metal film 72 is formed on the surface of the block high dielectric film 71 through the slit ST. The space on the surface of the barrier metal film 72 provided after removal of the filing film 21 is filled with a conductive material such as tungsten (W) to form the conductive member 61.

Next, as illustrated in FIG. 21, a portion of the conductive member 61 that faces the slit ST, a portion of the block insulating film 51 that faces the slit ST, a portion of the block high dielectric film 71 that faces the slit ST, and a portion of the barrier metal film 72 that face the slit ST are removed to form the word lines WL.

The configurations, manufacturing method, and effects of the semiconductor device according to the variation of the embodiment other than that described above are similar to those of the above-described embodiment.

(Comparative Example)

Figure 22:
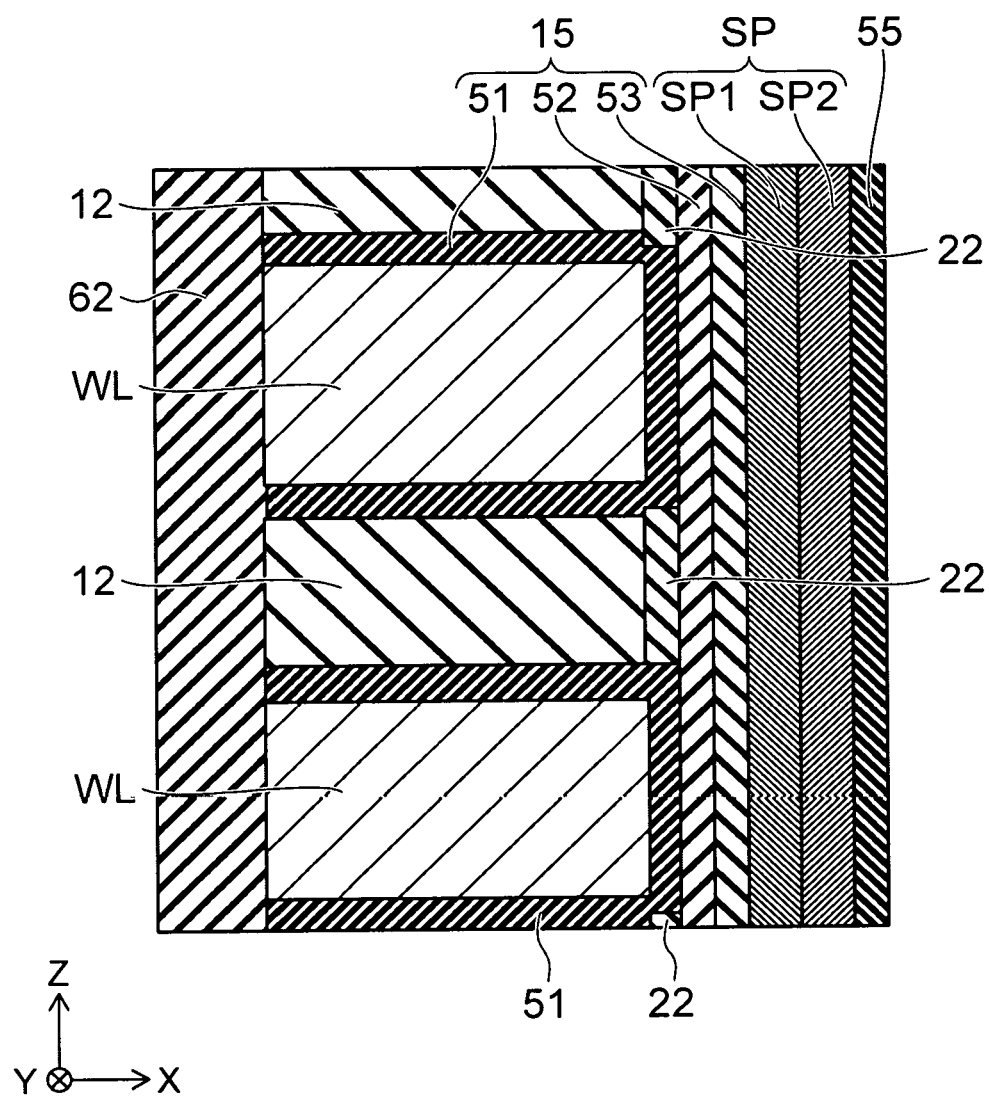
FIG. 22 is a cross-sectional view illustrating a semiconductor device according to a comparative example of the embodiment.

FIG. 22 is a cross-sectional view illustrating a semiconductor device according to a comparative example of the embodiment. What is illustrated in FIG. 22 is equivalent to the region B illustrated in FIG. 2.

As illustrated in FIG. 22, the semiconductor device according to the comparative example differs from the semiconductor device according to the embodiment (see FIG. 3) in that the silicon containing film 34 is not provided.

Accordingly, the surface of the insulating film 12 is removed by hot phosphoric acid and DHF in the manufacture of the semiconductor device. Because the amount of the film to be removed differs depending on the position of the insulating film 12 such as the center portion or the corner portion, the shape cannot be maintained. This result in a variation in the thickness of the insulating film 12, which causes a variation in the thickness of the word line WL provided between two insulating films 12.

As a result, it is difficult to provide a semiconductor device having stable characteristics, and a method for manufacturing such a semiconductor device.

The embodiments described above can provide a semiconductor device having stable characteristics, and a method for manufacturing such a semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, the method comprising:
    forming a stacked body, the stacked body including a first insulating film, a first silicon containing film provided on the first insulating film, a filing film provided on the first silicon containing film, and a second silicon containing film provided on the filing film, the first silicon containing film containing silicon and nitride, the filing film containing silicon and nitride, a silicon concentration in the filing film being lower than a silicon concentration in the first silicon containing film, the second silicon containing film containing silicon and nitride, a silicon concentration in the second silicon containing film being higher than the silicon concentration of the filing film;
    forming a memory hole penetrating the stacked body in a stacking direction of the first insulating film, the first silicon containing film, the filing film, and the second silicon containing film;
    forming a charge storage film on a surface of the memory hole;
    forming a second insulating film on a surface of the charge storage film;
    forming a semiconductor pillar on a surface of the second insulating film;
    forming a slit in the stacked body, the slit extending along a plane including the stacking direction;
    removing the filing film through the slit;
    forming a third insulating film on the first insulating film, the first silicon containing film, the second silicon containing film and the charge storage film through the slit;
    depositing a conductive material on the third insulating film and in a space through the slit to form an electrode film, the space being formed after the filing film being removed; and
    removing a portion of the electrode film adjacent to the slit to divide the electrode film along the stacking direction.

2. The method according to claim 1, wherein the forming the stacked body includes:
    forming the first insulating film; and
    forming the first silicon containing film, the filing film, and the second silicon containing film by plasma chemical vapor deposition using a first gas containing silicon and a second gas containing nitrogen as source gases; and
    a ratio of a flow rate of the first gas to a flow rate of the second gas in the forming the first silicon containing film and in the forming the second silicon containing film is higher than the ratio in the forming the filing film.

3. The method according to claim 2, wherein the first gas includes a silicon precursor gas, and the second gas includes an ammonia gas.

4. The method according to claim 2, wherein the first gas includes a silicon precursor gas, and the second gas includes a nitrogen gas.

5. The method according to claim 2, wherein the first gas includes a silicon precursor gas, and the second gas includes an inert gas other than a nitrogen gas.

6. The method according to claim 2, wherein the forming the first insulating film includes depositing silicon oxide by plasma chemical vapor deposition using a gas containing silicon and oxygen as a source gas.

7. The method according to claim 6, wherein the forming the stacked body further includes purging an inside of a chamber with a noble gas between the forming the first insulating film and the forming the first silicon containing film, the plasma chemical vapor deposition is performed in the chamber.

8. The method according to claim 1, further comprising:
    forming a cover film including an insulating material on a side surface of the memory hole before the forming the charge storage film; and
    removing a portion of the cover film through the slit, the portion of the cover film is in contact with the filing film after the removing the filing film.

9. The method according to claim 1, wherein the forming the semiconductor pillar includes:
    forming a first portion on an inner surface of the memory hole;
    removing the first portion, the second insulating film, and the charge storage film from a bottom surface of the memory hole by performing anisotropic etching; and
    forming a second portion on the inner surface of the memory hole.

* * * * *